United States Patent [19]
Mach et al.

[11] Patent Number: 6,081,424
[45] Date of Patent: Jun. 27, 2000

[54] MECHANISM FOR REMOVING HEAT FROM ELECTRONIC COMPONENTS

[75] Inventors: Terry P. Mach, Madison; Kurt R. Jackson, Decatur; Frank Hodges, Scottsboro; Alfred H. Glover, Decatur; Chandrakant Dave, Huntsville; Stephen J. Morris, Somerville; Joseph T. Betterton, Arab, all of Ala.

[73] Assignee: Chrysler Corporation, Auburn Hills, Mich.

[21] Appl. No.: 09/081,378

[22] Filed: May 19, 1998

[51] Int. Cl.⁷ ........................................................ H05K 7/20
[52] U.S. Cl. ........................ 361/704; 361/707; 361/710; 361/719; 361/722; 361/728; 361/736; 257/707; 257/726; 165/80.3; 165/185; 174/16.3
[58] Field of Search ............................ 361/689, 690, 361/704–719, 726–736, 806, 807, 809, 811; 257/706–726, 727; 165/80.1, 80.2, 80.3, 80.4, 185; 174/16.3; 248/316.7, 505, 507; 411/516, 520, 522; 24/295, 457, 458, 530, 531, 568, 570

[56] References Cited

U.S. PATENT DOCUMENTS

| D. 307,540 | 5/1990 | McCarthy | D8/395 |
|---|---|---|---|
| D. 357,227 | 4/1995 | Smithers | D13/179 |
| 3,021,581 | 2/1962 | Cook et al. | 24/73 |
| 4,669,028 | 5/1987 | Faa, Jr. | 361/386 |
| 5,138,524 | 8/1992 | Smithers | 361/386 |
| 5,225,965 | 7/1993 | Bailey et al. | 361/386 |
| 5,274,193 | 12/1993 | Bailey et al. | 174/163 |
| 5,327,324 | 7/1994 | Roth | 361/707 |
| 5,343,362 | 8/1994 | Solberg | 361/710 |
| 5,461,541 | 10/1995 | Wentland et al. | 361/707 |

*Primary Examiner*—Leo P. Picard
*Assistant Examiner*—Michael Datskovsky
*Attorney, Agent, or Firm*—Lawrence J. Shurupoff

[57] ABSTRACT

Heat is removed from electronic components located within a closed housing by the use of a heat-conducting metal clip mounted on the housing cover so as to be in pressure contact with the electronic components. The metal clip includes a U-shaped mounting portion firmly clamped to a clip-mounting wall projecting from the cover, and a series of spring arms extending through a slot opening in the cover into pressure contact with individual electronic components. The clamp force of the clip on the mounting wall is designed to act independently of the pressure exerted by each spring arm on an associated electronic component.

8 Claims, 2 Drawing Sheets

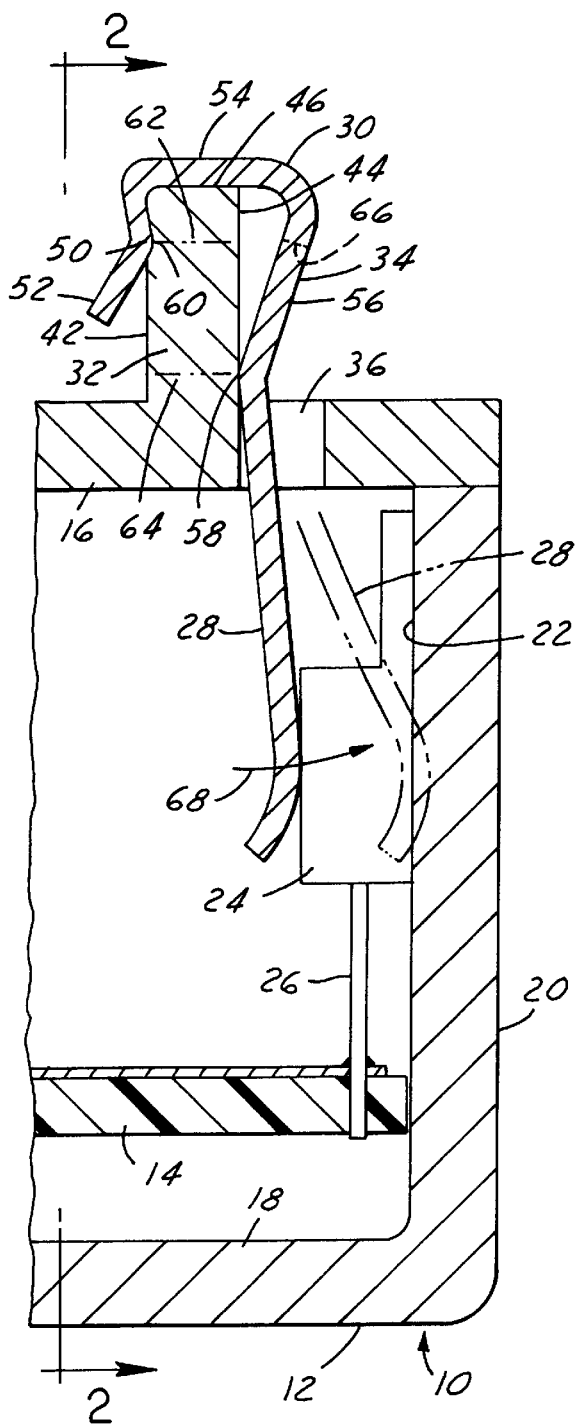
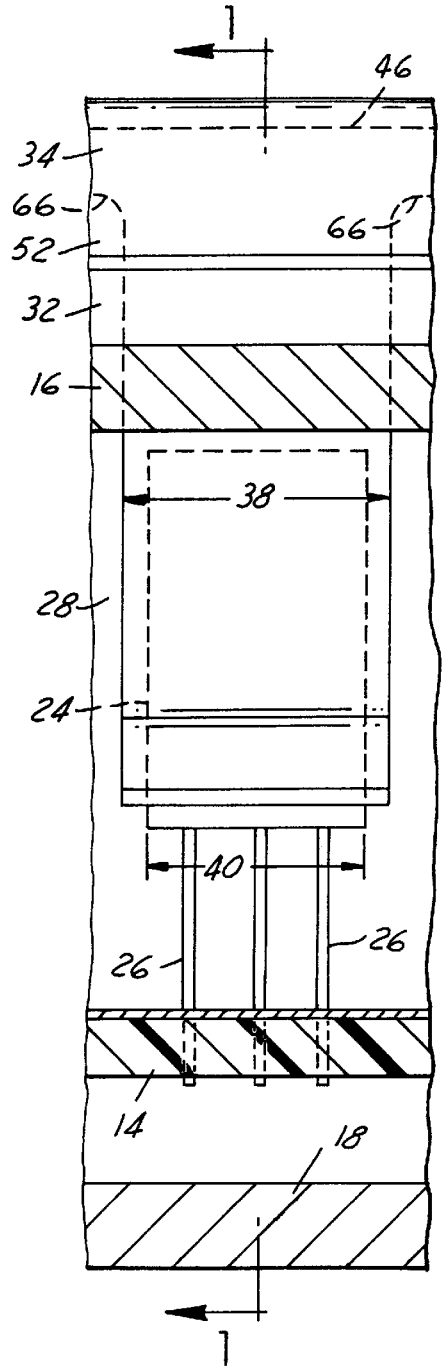
FIG.1
FIG.2

MECHANISM FOR REMOVING HEAT FROM ELECTRONIC COMPONENTS

BACKGROUND AND SUMMARY OF THE INVENTION

1. Field of the Invention

This invention relates to a mechanism for removing unwanted heat from electronic components located in an electronic housing, e.g. a housing containing electronic components mounted on a printed circuit board.

2. Description of Prior Developments

Prior to this invention various clip constructions have been proposed for removing heat from electronic components.

U.S. Pat. No. 5,225,965, issued to T. G. Bailey, shows an electronic apparatus that includes an array of electronic components seated against a housing surface by a spring clip that is operatively positioned by means of a wedge that abuts a cover for the apparatus housing. The spring clip has a series of spring fingers that have pressure contact with the electronic components to remove heat generated within the electronic components.

U.S. Pat. No. 5,327,324, issued to G. Roth, discloses an electronic apparatus wherein multiple electronic components are in pressure contact with individual spring fingers formed on an elongated metal clip that has retainers at its ends adapted to seat in pockets in the apparatus housing. Each spring finger comprises a metal strip bent into a U configuration.

U.S. Pat. No. 5,343,362, issued to T. Solberg, discloses a specially configured spring clip for removing heat from an individual electronic component. The clip includes a U-shaped mounting portion insertable into a mounting cavity and a deflectable arm extending from said mounting portion.

SUMMARY OF THE INVENTION

The present invention relates to a mechanism for removing heat from electronic components mounted within a housing, wherein the mechanism includes a metal clip having a U-shaped mounting portion have a grip fit on a wall projecting from a cover for the housing containing the electronic components. The metal clip further includes multiple spring arms swingably extending from the mounting portion for pressure contact with individual electronic components.

The electronic components of principal interest are integrated circuit assemblies available commercially as block-like devices. The invention contemplates a spring clip mounted on the cover of an electronic housing, and having multiple swingable arms adapted to have pressure contact with flat surfaces on various electronic components, whereby the clip is enabled to remove heat generated within the electronic components.

The mounting portion of the spring clip is designed to have line pressure contact with oppositely-facing surfaces on the mounting wall, such that the clip has a stable fit on the mounting wall. The grip exerted by the clip on the mounting wall is independent of the pressure exerted by the swingable arms on the electronic components, in order to permit adjustment or calibration of the pressure exerted by each arm on the associated electronic component.

The structure proposed herein is advantageous in that heat dissipation from each electronic component can be controlled by controlling the pressure of the spring clip on the electronic component surface.

The spring clip is designed so that each spring arm exerts a force on an associated electronic component that is essentially normal to the housing support surface for the component. The spring arm force is essentially normal to the electrical leads that mount the electronic component on the circuit board. Consequently, the spring arm force does not tend to break the leads or weaken the solder connections between the leads and the circuit board.

In preferred practice of the invention each spring clip can be mounted on the cover of the electronic housing prior to placement of the cover on the housing, or after the cover has been placed on the housing. The spring clips can be installed manually or with mechanical assembly devices.

An advantageous feature of the invention is that the spring clips operate without the use of wedges, screws or auxiliary clamps that have been used in the past. The clip arrangement is space efficient, whereby the electronic apparatus housing can be relatively small for a given electrical system.

Further features of the invention will be apparent from the attached drawing and description of a preferred embodiment of the invention.

DESCRIPTION OF THE DRAWINGS

FIG. 1 is a sectional view through one embodiment of the invention, taken on line 1—1 in FIG. 2.

FIG. 2 is a sectional view taken on line 2—2 in FIG. 1.

DESCRIPTION OF A PREFERRED EMBODIMENT OF THE INVENTION

Figure 3:
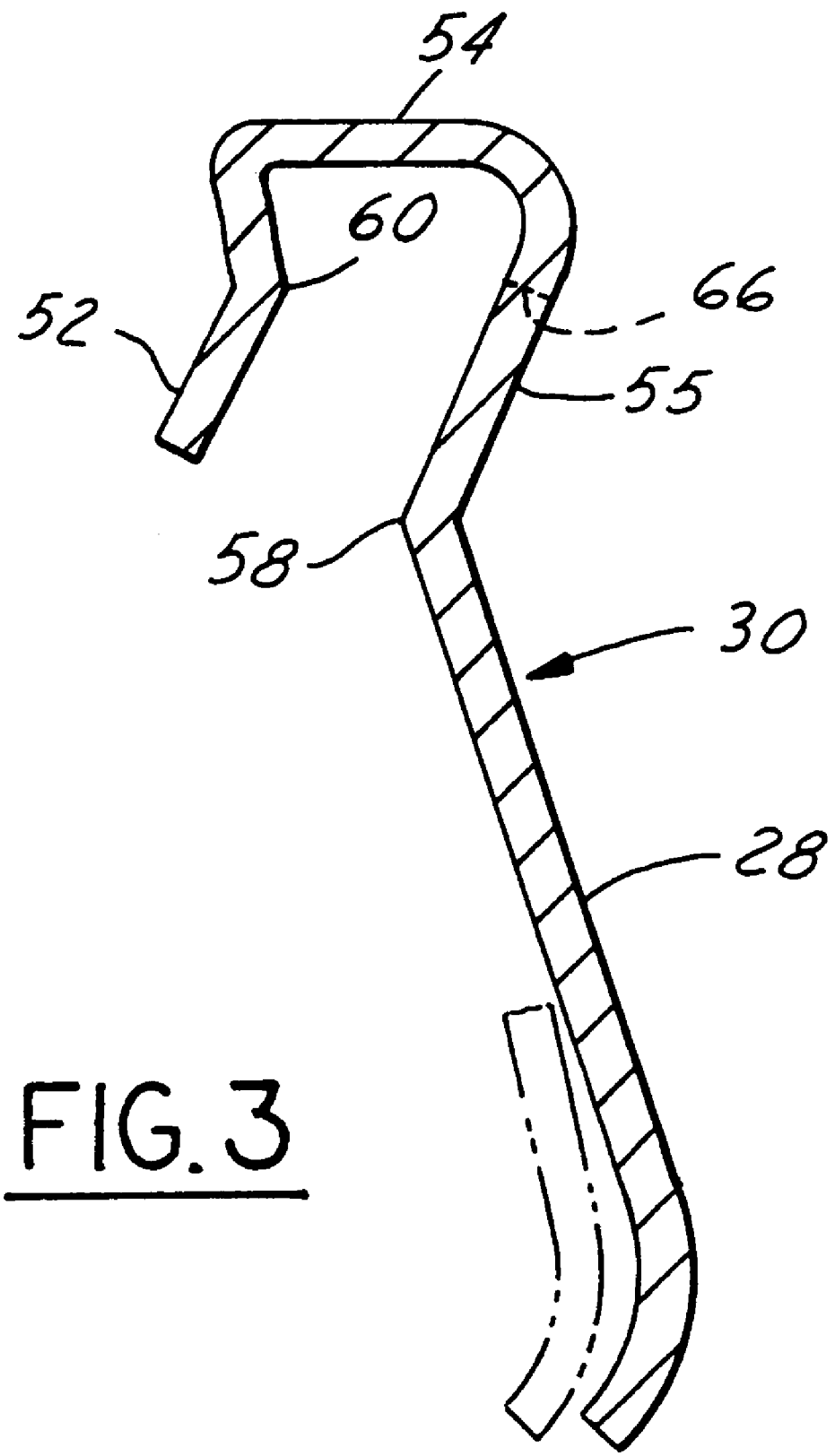
FIG. 3 is a sectional view taken through a spring clip used in the FIG. 1 apparatus showing the spring clip prior to installation in the FIG. 1 apparatus.

FIGS. 1 and 2 show an electronic apparatus 10 embodying features of the invention. The apparatus includes a housing 12 containing a printed circuit board 14, and a metal cover 16 adapted to close the housing. The cover may be releasably secured to the housing by means of screws extending through corner areas of the cover into threaded holes in the housing corners. Typically, the housing will be a rectangular box structure having a bottom wall 18 and four upstanding side walls 20 (only one of which appears in FIG. 1).

Side wall 20 of the housing provides a support surface 22 for a series of electronic or integrated circuit components 24 extending in a row along surface 22. FIG. 1 shows one such electronic component. In practice, other components are positioned against support surface 22 in a row configuration normal to the plane of the paper in FIG. 1. Each electronic component has multiple wire leads 26 soldered to circuit board 14. Each electronic component 24 may be held against support surface 22 by a spring arm 28 that forms part of a metal spring clip 30. In one specific arrangement, a single spring clip 30 has four depending spring arms 28 spaced along the clip length dimension normal to the plane of the paper in FIG. 1, whereby the single spring clip exerts pressure on four electronic components 24.

The spring clip-electronic component arrangement 24, 30 can be duplicated at the other side walls of housing 12. FIG. 1 is merely illustrative of the relationship between one spring clip and one row of electronic components.

Metal cover 16 has a clip-mounting wall 32 projecting away from the housing interior space for mounting the spring clip 30. The spring clip includes a U-shaped mounting portion 34 in gripping relation to mounting wall 32, and multiple swingable spring arms 28 extending through a slot opening 36 in cover 16 so as to have pressure contact with electronic components 24. As shown in FIG. 2, each spring arm 28 has a width dimension 38 that is at least as great as the width dimension 40 of the associated electronic component 24, whereby each arm 28 has a significant surface area in contact with the associated electronic component.

Each spring clip 30 serves as a mechanism for removing heat from electronic components 24. The heat transfer path extends through spring arms 28, mounting portion 34, wall 32, and cover 16. Depending on the heat load, the cover can be equipped with external heat-dissipating fins, not shown. Some heat is dissipated from the electronic components 24 through housing side wall 20.

Clip mounting wall 32 extends transversely the full transverse length of U-shaped mounting portion 34. Wall 32 has two oppositely facing surfaces 42 and 44, and a connecting edge 46. Surface 44 is flat from the face of cover 16 to edge 46. Surface 42 has a full length groove 50 spaced from edge 46 to receive therein a convex V-shaped section 60 of a flange 52 on mounting portion 34.

Mounting portion 34 of the spring clip comprises a web 54, the aforementioned flange 52, and a clamping wall 56. The aforementioned swingable spring arms 28 extend from clamping wall 56 through slot opening 36 to exert pressure on electronic components 24.

The integral connection between clamping wall 56 and spring arms 28 is formed by a relatively sharp bend line 58 that establishes the contact between wall 56 and surface 44 of clip mounting wall 32. The contact plane between clip flange 52 and surface 42 of wall 32 is established by the convex V-shaped section 60 of the flange.

As shown in FIG. 3, spring clip 30 is initially formed out of a single metal strip so that the horizontal spacing between V-section 60 of flange 52 and bend line 58 on clamping wall 56 is slightly less than the horizontal thickness of wall 32. When spring clip 30 is installed on wall 32, the clip walls 52 and 56 are slightly spread apart so that the clip has a relatively tight grip on wall 32, sufficient to retain the clip in place on wall 32.

V-section 60 of flange 52 provides a pressure contact plane 62 spaced a first distance from edge 46 of wall 32. Bend line 58 on wall 56 provides a second pressure contact plane 64 spaced a second distance from edge 46. As viewed in FIG. 1, the spacing between pressure contact plane 62 and edge 46 is less than the spacing between pressure contact plane 64 and edge 46. This is advantageous in that the opposing clamp forces are offset from one another to provide a stable non-wobble fit of mounting portion 34 on wall 32.

The clamp forces of mounting portion 34 on wall 32 (along planes 62 and 64) act independently of the spring forces exerted by spring arms 28 on electronic components 24. The spring force exerted by each spring arm 28 is related to the deflection experienced by the spring arm when it makes contact with the associated electrical component 24. FIG. 1 shows in dash lines a representative spring arm in its free state prior to making contact with an electronic component 24. When the spring arm is brought into contact with the electronic component 24 the spring arm is deflected to the fill line position depicted in FIG. 1. The spring force built into each swingable arm 28 is a function of the deflection. As noted earlier, the spring arm force is essentially independent of the clamping force exerted by mounting portion 34 on wall 32. This is a feature of the present invention.

The force exerted by one spring arm 28 on the associated electronic component 24 can be different than the spring force exerted by another spring arm on its electronic component. By initially forming the spring clip so that the spring arms 28 have different angulations as shown in dashed lines in FIG. 3 or different widths, it is possible to achieve different spring arm forces. Also, the spring arm angulation can be used for force calibration purposes.

Clamping wall 56 is joined to each spring arm 28 by a transverse bend line 58. The areas of clamping wall 56 between adjacent spring arms 28 have lower edges 66 that are upwardly recessed from bend lines 58. This recessing of edges 66 is advantageous in that edges 66 are thereby precluded from influencing the bending and swinging action of arms 28. Edges 66 are spaced from bend lines 58 so that areas of wall 56 between the spring arms do not affect the bending action of arms 28 around bend lines 58.

The surfaces of arms 28 in contact with electronic components 24 exert pressure along an arcuate line 68 taken around bend line 58. The radius of arc 68 is relatively great, and the deflected arm 28 is so positioned that the pressure force on electronic component 24 is essentially normal to the back-up support surface 22. Wire leads 26 are constructed and oriented so that pressures along line 68 do not weaken the leads or the solder connections with the printed circuit.

A principal feature of the invention is the relationship between spring clip 30 and clip mounting wall 32, whereby the clip mounting clamp forces along offset pressure contact lines 62 and 64 firmly mount the clip on wall 32 without affecting the force that each spring arm 28 exerts on the aligned electronic component 24. The bend line 58 for each spring arm is immovable on the surface of wall 32 so that each spring arm exerts a predetermined force on the associated electronic component 24 related to the spring arm deflection produced during the clip installation process.

What is claimed:

1. In an electronic apparatus that includes a housing having a support surface for multiple heat-generating electronic components, and a cover for said housing, the improvement comprising a mechanism for removing heat from said electronic components: said mechanism comprising a clip-mounting wall projecting from said cover, and a heat-conducting spring clip mounted on said wall; said clip having a U-shaped mounting portion in gripping relation to said mounting wall, and multiple swingable arms in pressure contact with said electronic components; said mounting wall having first and second oppositely facing clip mount surfaces, and an interconnecting edge; said U-shaped mounting portion including a web fitting against the edge of said mounting wall, a flange seating against said first clip mount surface, and a clamping wall seating against said second clip mount surface; said flange having line pressure contact with said first clip mount surface on a plane spaced a first distance from said edge; said clamping wall having line pressure contact with said second clip mount surface on a plane spaced a second distance from said edge; said second distance being different than said first distance.

2. The improvement of claim 1, wherein said first distance is less than said second distance.

3. The improvement of claim 1, wherein said first clip-mount surface has a groove spaced from said edge by said first distance, said flange having a convex surface seated in said groove to establish line pressure contact with said first clip mount surface.

4. The improvement of claim 1, wherein said multiple swingable arms are joined to said clamping wall along a bend line that establishes the pressure contact line between said clamping wall and said second clip mount surface, whereby said swingable arms can individually swing around said bend line without affecting the clamping pressure between said clip and said clip-mounting wall.

5. The improvement of claim 4, wherein said clamping wall has recessed edges spaced from said bend line, so as to interrupt said bend line.

6. The improvement of claim 4, wherein said swingable arms are spaced apart along said clamping wall; said clamping wall having recessed edges spaced from said bend line in the spaces between said swingable arms.

7. The improvement of claim 1, wherein said clip is a one-piece element formed out of a single sheet of spring metal.

8. The improvement of claim 1, wherein said cover has a slot opening proximate to said clip-mounting wall; said clip being mounted on said clip-mounting wall so that said swingable arms extend through said slot opening.

* * * * *